United States Patent
Konakalla et al.

(10) Patent No.: US 11,903,161 B2
(45) Date of Patent: Feb. 13, 2024

(54) FAN SUPPORT

(71) Applicant: Intel Corporation, Santa Clara, CA (US)

(72) Inventors: Srinivas Rao Konakalla, Bangalore (IN); Prakash Kurma Raju, Bangalore (IN); Bijendra Singh, Bangalore (IN); Juha Tapani Paavola, Hillsboro, OR (US); Prasanna Pichumani, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 719 days.

(21) Appl. No.: 16/914,162

(22) Filed: Jun. 26, 2020

(65) Prior Publication Data
US 2020/0352052 A1    Nov. 5, 2020

(51) Int. Cl.
| | |
|---|---|
| *H05K 7/02* | (2006.01) |
| *H05K 7/20* | (2006.01) |
| *H02K 7/08* | (2006.01) |
| *H02K 7/14* | (2006.01) |
| *H02K 21/22* | (2006.01) |
| *F04D 25/06* | (2006.01) |
| *F04D 25/08* | (2006.01) |
| *F04D 27/00* | (2006.01) |
| *G06F 1/20* | (2006.01) |
| *F04D 17/00* | (2006.01) |

(52) U.S. Cl.
CPC ..... *H05K 7/20172* (2013.01); *F04D 25/0606* (2013.01); *F04D 25/0666* (2013.01); *F04D 25/08* (2013.01); *F04D 27/00* (2013.01); *G06F 1/203* (2013.01); *H02K 7/088* (2013.01); *H02K 7/14* (2013.01); *H02K 21/22* (2013.01); *F04D 17/00* (2013.01)

(58) Field of Classification Search
CPC ........ H02K 5/1675; H02K 7/085; H02K 7/09; H02K 16/02; H02K 29/08; H02K 5/1677; H02K 1/00; H02K 1/145; H02K 49/102; F04D 25/064; F04D 25/062; F04D 25/0613; F04D 25/0653; F04D 19/002; F04D 29/056; F16C 2360/46; H05K 7/20172; F28F 2250/08
See application file for complete search history.

(56) References Cited

U.S. PATENT DOCUMENTS

| | | | | |
|---|---|---|---|---|
| 4,686,400 | A | * | 8/1987 | Fujisaki ................. H02K 29/08 310/90 |
| 5,925,948 | A | * | 7/1999 | Matsumoto ............ H02K 11/33 310/216.115 |

(Continued)

*Primary Examiner* — Michael A Matey
(74) *Attorney, Agent, or Firm* — Patent Capital Group (57) ABSTRACT

Particular embodiments described herein provide for an electronic device that can be configured to include a fan where the fan blades are decoupled from the center shaft. The fan can include a center shaft, a motor coil support, motor coils coupled to the motor coil support, a rotator coupled to the center shaft, and fan blades coupled to the rotator, where rotation of the fan blades is decoupled from the center shaft by the rotator. A blade support can be coupled to the rotator, where the blade support couples the fan blades to the rotator and magnets can be coupled to the blade support. In an example, the rotator can include an inner, an outer race, and bearings.

20 Claims, 7 Drawing Sheets

(56) References Cited

U.S. PATENT DOCUMENTS

| | | | | |
|---|---|---|---|---|
| 5,982,064 A * | 11/1999 | Umeda | | F16C 21/00 |
| | | | | 310/90 |
| 6,376,946 B1 * | 4/2002 | Lee | | H02K 5/1675 |
| | | | | 310/90 |
| 7,211,915 B2 * | 5/2007 | Conrady | | F16C 19/55 |
| | | | | 310/90 |
| 7,510,329 B2 * | 3/2009 | Shishido | | H02K 7/085 |
| | | | | 384/100 |
| 2002/0122724 A1 * | 9/2002 | Tseng | | F04D 29/325 |
| | | | | 416/175 |
| 2005/0063842 A1 * | 3/2005 | Park | | F04D 25/066 |
| | | | | 417/423.1 |
| 2005/0184609 A1 * | 8/2005 | Chen | | F16C 32/041 |
| | | | | 310/90.5 |
| 2005/0200216 A1 * | 9/2005 | Brown | | F04D 29/668 |
| | | | | 310/90 |
| 2005/0233688 A1 * | 10/2005 | Franz | | F04D 29/329 |
| | | | | 454/157 |
| 2006/0120063 A1 * | 6/2006 | Lai | | F04D 25/06 |
| | | | | 362/253 |
| 2006/0131972 A1 * | 6/2006 | Yang | | F16C 39/06 |
| | | | | 310/90.5 |
| 2007/0075598 A1 * | 4/2007 | Tung | | F04D 25/064 |
| | | | | 310/67 R |
| 2007/0080604 A1 * | 4/2007 | Yang | | F04D 25/0646 |
| | | | | 310/67 R |
| 2007/0092370 A1 * | 4/2007 | Malone | | G06F 1/20 |
| | | | | 415/123 |
| 2007/0152519 A1 * | 7/2007 | Jarrah | | F04D 25/082 |
| | | | | 310/58 |
| 2008/0074010 A1 * | 3/2008 | Jungmayr | | F04D 25/0653 |
| | | | | 318/632 |
| 2009/0180902 A1 * | 7/2009 | Tung | | F04D 25/082 |
| | | | | 417/354 |
| 2010/0109465 A1 * | 5/2010 | Yang | | H02K 21/22 |
| | | | | 310/68 B |
| 2010/0316514 A1 * | 12/2010 | Horng | | H02K 3/47 |
| | | | | 417/422 |
| 2011/0097221 A1 * | 4/2011 | Horng | | F04D 25/0613 |
| | | | | 310/91 |
| 2012/0235526 A1 * | 9/2012 | Wu | | H02K 5/1675 |
| | | | | 310/90 |
| 2012/0247739 A1 * | 10/2012 | Fujiwara | | F04D 29/424 |
| | | | | 415/220 |
| 2016/0047420 A1 * | 2/2016 | Miyasaka | | F16C 17/243 |
| | | | | 310/90 |
| 2019/0235982 A1 * | 8/2019 | North | | G06F 1/203 |

* cited by examiner

FAN SUPPORT

TECHNICAL FIELD

This disclosure relates in general to the field of computing and/or device cooling, and more particularly, to a fan support system.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a fan support system. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

Figure 1A:
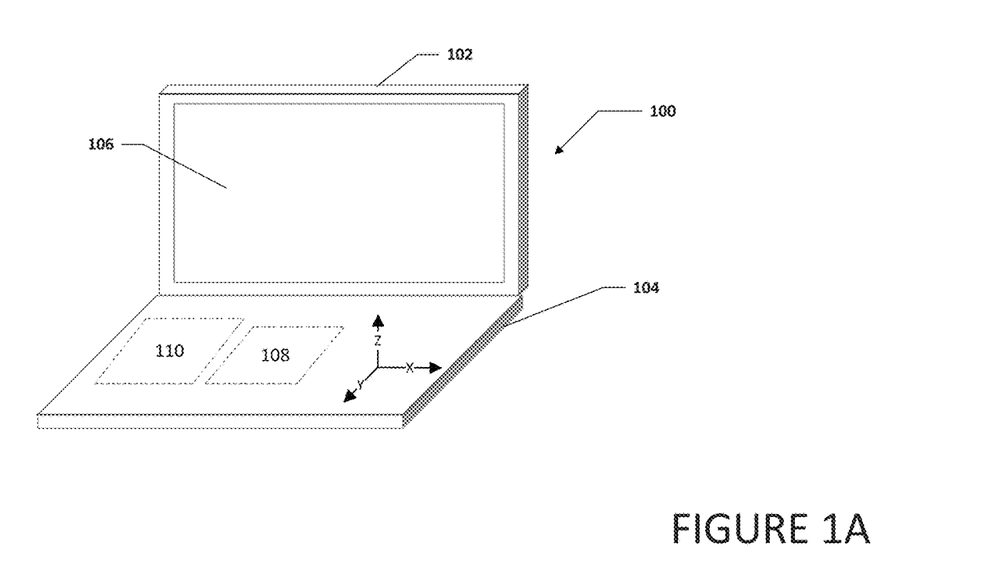
FIGS. 1A and 1B are a simplified block diagram of a device that includes a fan support system, in accordance with an embodiment of the present disclosure.

FIG. 1A is a simplified block diagram of an electronic device configured to enable a fan support system, in accordance with an embodiment of the present disclosure. In an example, electronic device 100 can include a first housing 102 and a second housing 104. First housing 102 can include a display 106. Second housing 104 can include a fan 108 and a heat source 110.

Figure 1B:
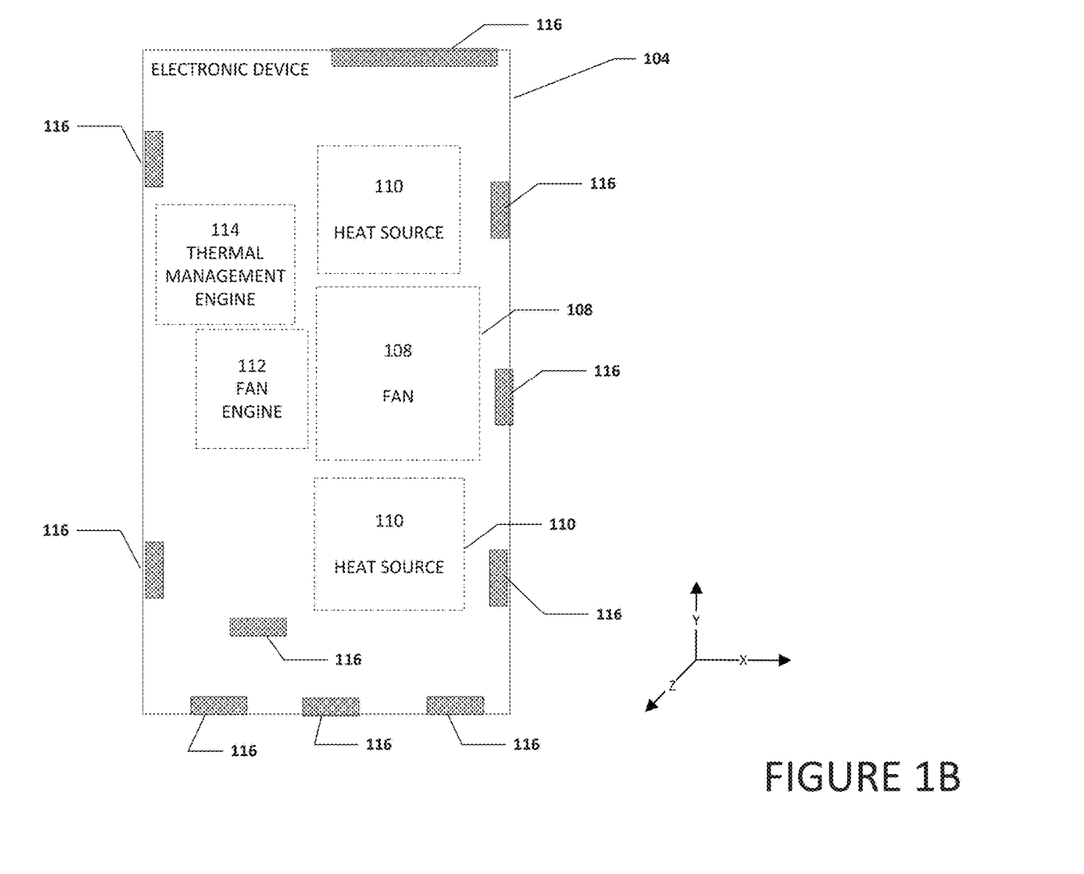

Turning to FIG. 1B, FIG. 1B is a simplified block diagram of an electronic device configured to enable a fan support system, in accordance with an embodiment of the present disclosure. In an example, second housing 104 can include fan 108, one or more heat sources 110, a fan engine 112, a thermal management engine 114, and one or more vents 116.

Each of one or more heat sources 110 may be a heat generating device (e.g., processor, logic unit, field programmable gate array (FPGA), chip set, a graphics processor, graphics card, battery, memory, or some other type of heat generating device). Fan 108 can be configured as an air-cooling system to help reduce the temperature or thermal energy of one or more heat sources 110. Electronic device 100 can include one or more fans 108. Fan engine 112 can be configured to control the velocity or speed of fan 108. Thermal management engine 114 can be configured to collect data or thermal parameters related to thermal properties of one or more heat sources 110 and other components, elements, devices (e.g., battery, device or group of devices available to assist in the operation or function of electronic device 100, etc.) in electronic device 100 and communicate the data to fan engine 112. The term "thermal parameters" includes a measurement, range, indicator, etc. of an element or condition that affects the thermal response, thermal state, and/or thermal transient characteristics of the heat source associated with the thermal parameters. The thermal parameters can include a platform workload intensity, a computer processing unit workload or processing speed, a data workload of a neighboring device, fan speed, air temperature (e.g., ambient air temperature, temperature of the air inside the platform, etc.), power dissipation of the device, or other indicators that may affect the thermal condition of second housing 104.

In an example, fan 108 can be configured to have a shaft that is decoupled from the fan blade or rotating member instead of having the shaft integrated into the fan blade as it is with most current fan designs. In a specific example, the center shaft of fan 108 is decoupled from the rotating members of fan 108 and is supported by a rotation means (e.g., ball bearings) that allow the center shaft to be a static member. Because the center shaft of fan 108 does not rotate, the center shaft of fan 108 can be longer as compared to some current fan designs and the gap between the center shaft of fan 108 and the chassis of second housing 104 can be smaller. This allows for a relatively thinner form factor because if the chassis of second housing 104 touches the center shaft of fan 108, it will not affect the rotation of fan 108 or a rotating member of fan 108.

In another example, the center shaft of fan 108 can act as a support and be extended from a top cover of the chassis of second housing 104 to a bottom cover of the chassis of second housing 104. Bearings (e.g., copper bearings) can be coupled to the top cover of the chassis and the bottom cover of the chassis. The top and bottom portion of the center shaft of fan 108 can couple with the bearings on the top cover and on the bottom cover so the center shaft of fan 108 can rotate with relatively low friction. The extra support enables the use of a chassis with a skin thickness as low as about 0.6 millimeters and helps to allow for a relatively low Z-height chassis because the chassis skin is supported by the center shaft of fan 108 and the chassis will not touch or deflect into the rotating portion of fan 108. Under test loading conditions, the deflection of the chassis is relatively small due to the extra support from the bearings and the center shaft of fan 108. In addition, the center shaft of fan 108 can help reduce the air gap requirement from about 1.5 millimeters to about 0.8 millimeters. With a thin chassis and reduced air gap, the overall system Z-height can be reduced by more than one (1) millimeter as compared to some current devices. This allows for a thinner chassis with less air gap and can help allow for a system with a relatively low Z-height and reduction in overall system weight as compared to some current fan designs. The term "Z height," "Z location," etc. refers to the height along the "Z" axis of an (x, y, z) coordinate axis or cartesian coordinate system.

It is to be understood that other embodiments may be utilized and structural changes may be made without departing from the scope of the present disclosure. Substantial flexibility is provided by electronic device 100 in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

For purposes of illustrating certain example techniques of electronic device 100, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems. One of the most common solutions to address the thermal challenges of devices and systems is to use a fan.

Most existing fans used in electronic devices are manufactured with a sleeve bearing and a stator section. The stator section includes a journal sleeve, motor coils, and a motor printed circuit board. The stator section is attached to a fan supporting plate that has fan mounting holes to secure the fan to the chassis or housing of the electronic device. The sleeve bearing is attached to the stator coils while the shaft may be laser welded to the fan rotor. Because existing dish fans typically do not have any enclosure around the fan rotor part, the fan mounting structure is designed such that adjacent components like the chassis of the electronic device must not interfere with the rotor part of the fan, even under loading conditions. If there is deflection of the chassis, the chassis can come into contact with the rotating parts of the fan unless steps are taken to help ensure that the chassis does not interfere with the rotor part of the fan.

One possible way to help ensure that the chassis does not interfere with the rotor part of the fan is to include a relatively large gap (e.g., about 1.2 millimeters to about 1.5 millimeters) between the chassis of the electronic device and the rotor. The relatively large gap helps to avoid interference with the rotor part of the fan under external loading conditions and helps to ensure that the chassis does not interfere with the rotor part of the fan so, even under loading, the chassis will not come into contact with the rotating parts of the fan. In addition, some systems include structural support pillars. Typically, the structural support pillars are about five (5) millimeters to about ten (10) millimeters away from the tip of the fan blade. Also, a thicker chassis/skin in the vicinity of the fan rotor may be used to help avoid deflection of the chassis and to ensure that the chassis does not interfere with the rotor part of the fan so, even under loading, the chassis will not come into contact with the rotating parts of the fan.

However, the relatively large gap between the fan blades and the chassis and the pillars often adversely impacts air flow and acoustics of the fan. A thick chassis in the fan region also increases the weight of the chassis and the electronic device that includes the fan and the thick chassis requires additional machining operations to create a non-uniform chassis thickness. The fan gap requirements and thicker chassis can also cause an overall Z-height increase in the system.

To help support a relatively thin form factor device (e.g., less than thirty-six (36) centimeters in total Z-height), the chassis skin thickness needs to be reduced to less than about 0.8 millimeters to help achieve the desired relatively small system Z-height. However, in some current systems, a thin chassis thickness is not possible throughout the chassis area as a few regions of the chassis require at least about one (1) millimeter to meet test loading conditions, especially in the fan region. Typically, a dish fan or external motor fans are caseless and these are directly mounted on one side of the chassis and there is a gap on the other side of the chassis to help the rotating members of the fan avoid touching the chassis. In addition, there is a strict requirement that the portion of the chassis that is in close proximity to the rotating parts of the fan needs to be stiff and must pass test loading conditions. The deflection of the chassis near the fan region remains a critical issue when thickness of the chassis is less than about 0.8 millimeters and will force a system design with a higher air gap between the rotating parts of the fan and the chassis to avoid having the rotating parts of the fan coming into contact with the chassis. The larger air gap between the fan and chassis impacts the fan's performances. Moreover, under a constant loading condition, the chassis undergoes permanent deflection, which is a critical issue to be addressed for original equipment manufacturers (OEMs) and original design manufactures (ODMS). What is needed is a fan support that can help to reduce the height of the electronic device while also helping to ensure that the chassis does not interfere with the rotor part of the fan so, even under loading, the chassis will not come into contact with the rotating parts of the fan.

A fan support that can help to reduce the Z-height of an electronic device while also helping to ensure that the adjacent components do not interfere with the rotating parts of the fan, as outlined in FIG. 1, can resolve these issues (and others). In an example, a fan for an electronic device (e.g., electronic device 100) can include a shaft that is decoupled from the fan blade or rotating member of the fan. The shaft can be attached to the stator portion of the fan. The stator portion of the fan can be comprised of a bearing housing and motor coils and can be coupled to a fan supporting plate used for mounting the fan on the chassis of the electronic device. In some examples, the fan is attached to a top side or cover of the chassis for the electronic device and the shaft is extended relatively close to the bottom side or cover of the chassis of the electronic device. A small clearance can be maintained to help avoid any shear load from being transferring from the bottom side or cover of the chassis to the shaft of the fan. Under the loading on the bottom side or cover of the housing near the fan region, the shaft helps to prevent the bottom side or cover of the chassis from contacting the rotating parts of the fan.

In another example, the rotor of the fan can act as a center support and be extended from the top cover of the chassis to the bottom cover of the chassis to give extra support at the center of the fan. A profiled top and bottom portion of the rotor of the fan can couple with rotation elements (e.g., bearings) to help to allow for minimum friction under external loading condition when the chassis might interfere with the fan. In a specific example, the profiled top and bottom portion of the rotor of the fan may be pointed tip structures. The rotation elements can be on the top cover of the chassis and the bottom cover of the chassis and couple with the profiled top and bottom portion of the rotor of the fan to allow the rotor to rotate with a relatively small amount of friction. In a specific example, the rotation elements can be copper bearings embedded in the top cover of the chassis and bottom cover of the chassis of the electronic device such that the pointed tip structures on the top and bottom portions of the rotor rest on the rotation elements to further reduce the friction in case of interference. The top cover of the chassis and/or the bottom cover of the chassis can also include vibration dampeners in the fan region to absorb at least a portion of the energy generated as the fan rotates.

In an example implementation, electronic device 100, is meant to encompass a computer, a personal digital assistant (PDA), a laptop computer, an electronic notebook, a cellular telephone, an iPhone, an IP phone, network elements, network appliances, servers, routers, switches, gateways, bridges, load balancers, processors, modules, or any other device, component, element, or object that includes at least one heat source and at least one fan. Electronic device 100 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100 may include virtual elements.

In regards to the internal structure, electronic device 100 can include memory elements for storing information to be used in the operations outlined herein. Electronic device 100 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, the functions outlined herein may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

In an example implementation, electronic device 100 may include software modules (e.g., fan engine 112, thermal management engine 114, etc.) to achieve, or to foster, operations as outlined herein. These modules may be suitably combined in any appropriate manner, which may be based on particular configuration and/or provisioning needs. In example embodiments, such operations may be carried out by hardware, implemented externally to these elements, or included in some other network device to achieve the intended functionality. Furthermore, the modules can be implemented as software, hardware, firmware, or any suitable combination thereof. These elements may also include software (or reciprocating software) that can coordinate with other network elements in order to achieve the operations, as outlined herein.

Additionally, electronic device 100 may include a processor that can execute software or an algorithm to perform activities as discussed herein. A processor can execute any type of instructions associated with the data to achieve the operations detailed herein. In one example, the processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Figure 2:
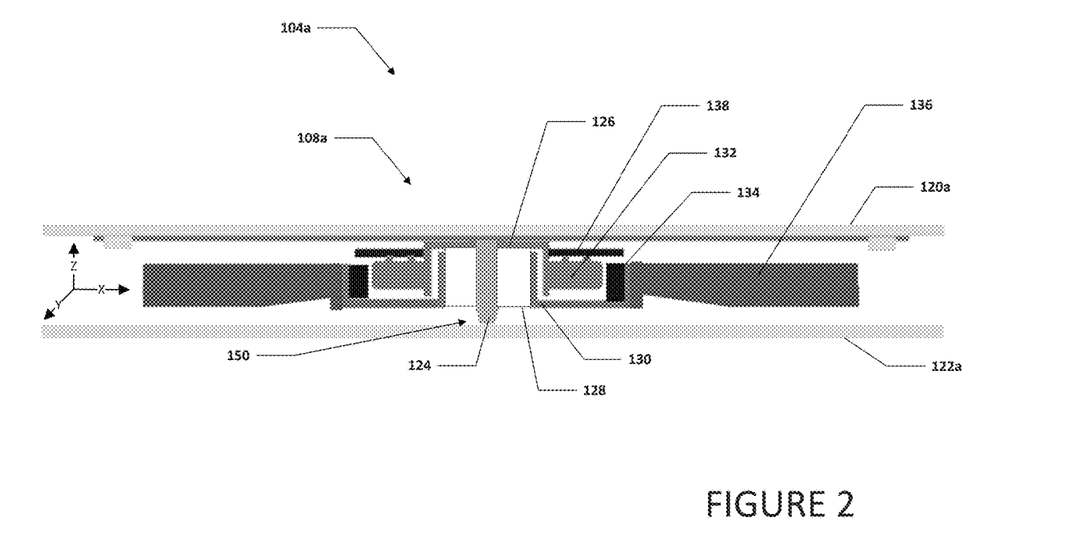
FIG. 2 is a simplified block diagram of a portion of a system to enable a fan support system, in accordance with an embodiment of the present disclosure.

Turning to FIG. 2, FIG. 2 is a simplified side view cutaway block diagram of a portion of an electronic device configured to include a fan support. In an example, a second housing 104a can include a top cover 120a and a bottom cover 122a. In some examples, second housing 104a may be a standalone device where there is not a first housing (e.g., a tablet, smartphone, etc.). Top cover 120a and bottom cover 122a can be part of the chassis of second housing 104a.

Second housing 104a can include a fan 108a. Fan 108a can include a center shaft 124, a motor coil support 126, a rotator 128, a blade support 130, motor coils 132, magnets 134, fan blades 136, and fan engine connection 138. Center shaft 124 can be secured to top cover 120a. In an example, center shaft 124 can be secured to a fan base plate or some other structure that is secured to top cover 120a. Motor coil support 126 can be coupled to top cover 120a. In an example, motor coil support 126 can be coupled to center shaft 124. Motor coil support 126 is static and does not rotate. Rotator 128 can be coupled to center shaft 124. In an example, if motor coil support 126 is coupled to center shaft 124, rotator 128 can be coupled to motor coil support 126. Blade support 130 can be coupled to rotator 128. Motor coils 132 can be coupled to motor coil support 126. Magnets 134 and fan blades 136 can be coupled to blade support 130. Fan engine connection 138 can be coupled to motor coils 132.

When motor coils 132 are activated by fan engine 112 (illustrated in FIG. 1A), magnets 134 interact with motor coils 132 to rotate fan 108a. Rotator 128 allows blade support 130 and fan blades 136 to rotate around center shaft 124. Center shaft 124 and motor coil support 126 do not rotate and are decoupled from the rotating portions of fan 108a by rotator 128. Because center shaft 124 does not rotate and is decoupled from the rotating portions of fan 108a, deflection of bottom cover of second housing 122a onto center shaft 124 does not affect the rotation of fan blades 136. This allows a gap 150 between center shaft 124 and bottom cover of second housing 122a to be relatively small when compared to current fan designs. For example, gap 150 may be about one (1) millimeter or less. In other examples, gap 150 may be about 0.8 millimeters or less, 1.5 millimeters or less, or some other distance.

Figure 3:
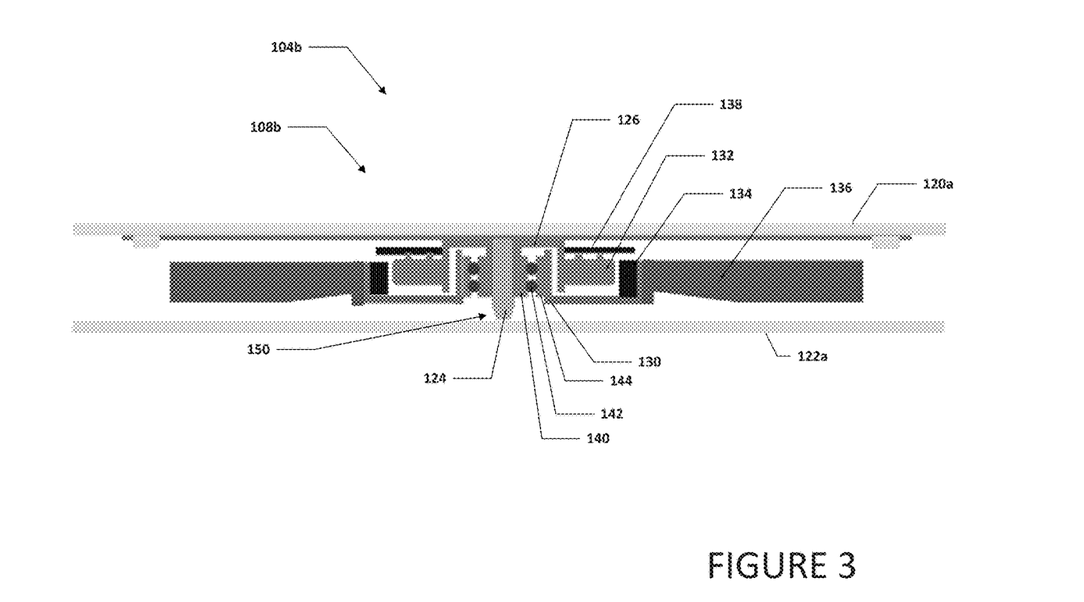
FIG. 3 is a simplified block diagram of a portion of a system to enable a fan support system, in accordance with an embodiment of the present disclosure.

Turning to FIG. 3, FIG. 3 is a simplified side view cutaway block diagram of a portion of an electronic device configured to include a fan support. In an example, a second housing 104b can include top cover 120a and bottom cover 122a. Second housing 104b may be a standalone device where there is not a first housing (e.g., a tablet, smartphone, etc.). Top cover 120a and bottom cover 122a can be part of the chassis of second housing 104b.

Second housing 104a can include a fan 108b. Fan 108b can include center shaft 124, motor coil support 126, blade support 130, motor coils 132, magnets 134, fan blades 136, fan engine connection 138, a bearing inner race 140, bearings 142, and a bearing outer race 144. Center shaft 124 can be secured to top cover 120a. In an example, center shaft 124 can be secured to a fan base plate or some other structure that is secured to top cover 120a. Motor coil support 126 can be coupled to top cover 120a. In an example, motor coil support 126 can be coupled to center shaft 124. Motor coil support 126 is static and does not rotate. Bearing inner race 140 can be coupled to center shaft 124. In an example, if motor coil support 126 is coupled to center shaft 124, bearing inner race 140 can be coupled to motor coil support 126. Bearing outer race 144 can be coupled to blade support 130. Bearings 142 can be between bearing inner race 140 and bearing outer race 144. Motor coils 132 can be coupled to motor coil support 126. Magnets 134 and fan blades 136 can be coupled to blade support 130. Fan engine connection 138 can be coupled to motor coils 132.

When motor coils 132 are activated by fan engine 112 (illustrated in FIG. 1A) through fan engine connection 138, magnets 134 can interact with motor coils 132 to rotate fan 108b. Bearings 142 allow blade support 130 and fan blades 136 to rotate around center shaft 124. Center shaft 124 and motor coil support 126 do not rotate and are decoupled from the rotating portions of fan 108a by bearing inner race 140. Because center shaft 124 does not rotate and is decoupled from the rotating portions of fan 108b, deflection of bottom cover 122a onto center shaft 124 does not affect the rotation of fan blades 136. This allows gap 150 between center shaft 124 and bottom cover 122a to be relatively small when compared to current fan designs. For example, gap 150 may be about one (1) millimeter or less. In other examples, gap 150 may be about 0.8 millimeters or less, 1.5 millimeters or less, or some other distance.

Figure 4:
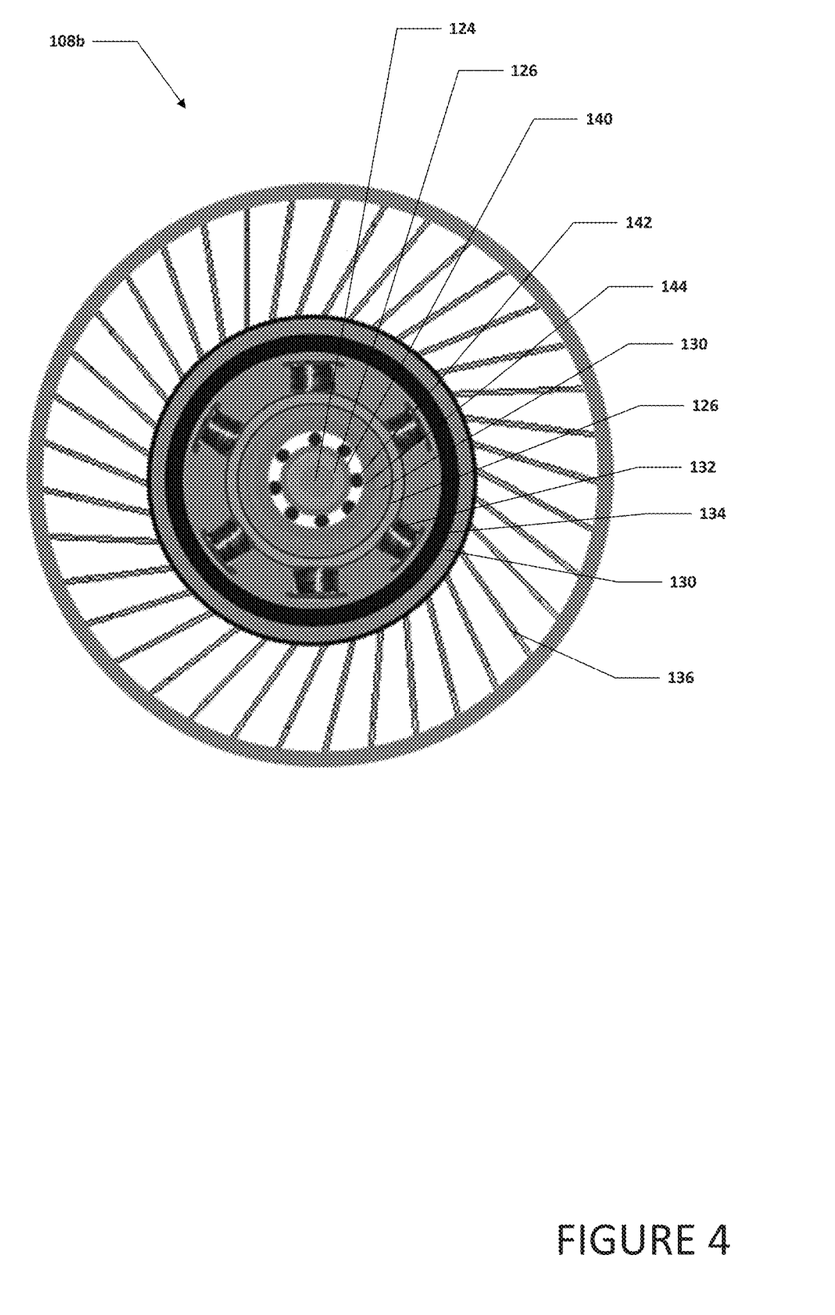
FIG. 4 is a simplified block diagram of a portion of a system to enable a fan support system, in accordance with an embodiment of the present disclosure.

Turning to FIG. 4, FIG. 4 is a simplified top view cutaway block diagram of a portion of an electronic device configured to include a fan support. As illustrated in FIG. 4, fan 108b can include center shaft 124, motor coil support 126, blade support 130, motor coils 132, magnets 134, fan blades 136, bearing inner race 140, bearings 142, and bearing outer race 144. Motor coil support 126 can be coupled to center shaft 124. Bearing inner race 140 can be coupled to motor coil support 126. Bearing outer race 144 can be coupled to blade support 130. Bearings 142 can be between bearing inner race 140 and bearing outer race 144. Motor coils 132 can be coupled to motor coil support 126. Magnets 134 and fan blades 136 can be coupled to blade support 130.

When motor coils 132 are activated by fan engine 112 (illustrated in FIG. 1A), magnets 134 interact with motor coils 132 to rotate fan 108b. Bearings 142 allow blade support 130 and fan blades 136 to rotate around center shaft 124. Center shaft 124 does not rotate and is decoupled from the rotating portions of fan 108b by bearing inner race 140 and motor coil support 126. Because center shaft 124 does not rotate and is decoupled from the rotating portions of fan 108b, deflection of bottom cover of second housing 122a onto center shaft 124 does not affect the rotation of fan blades 136.

Figure 5:
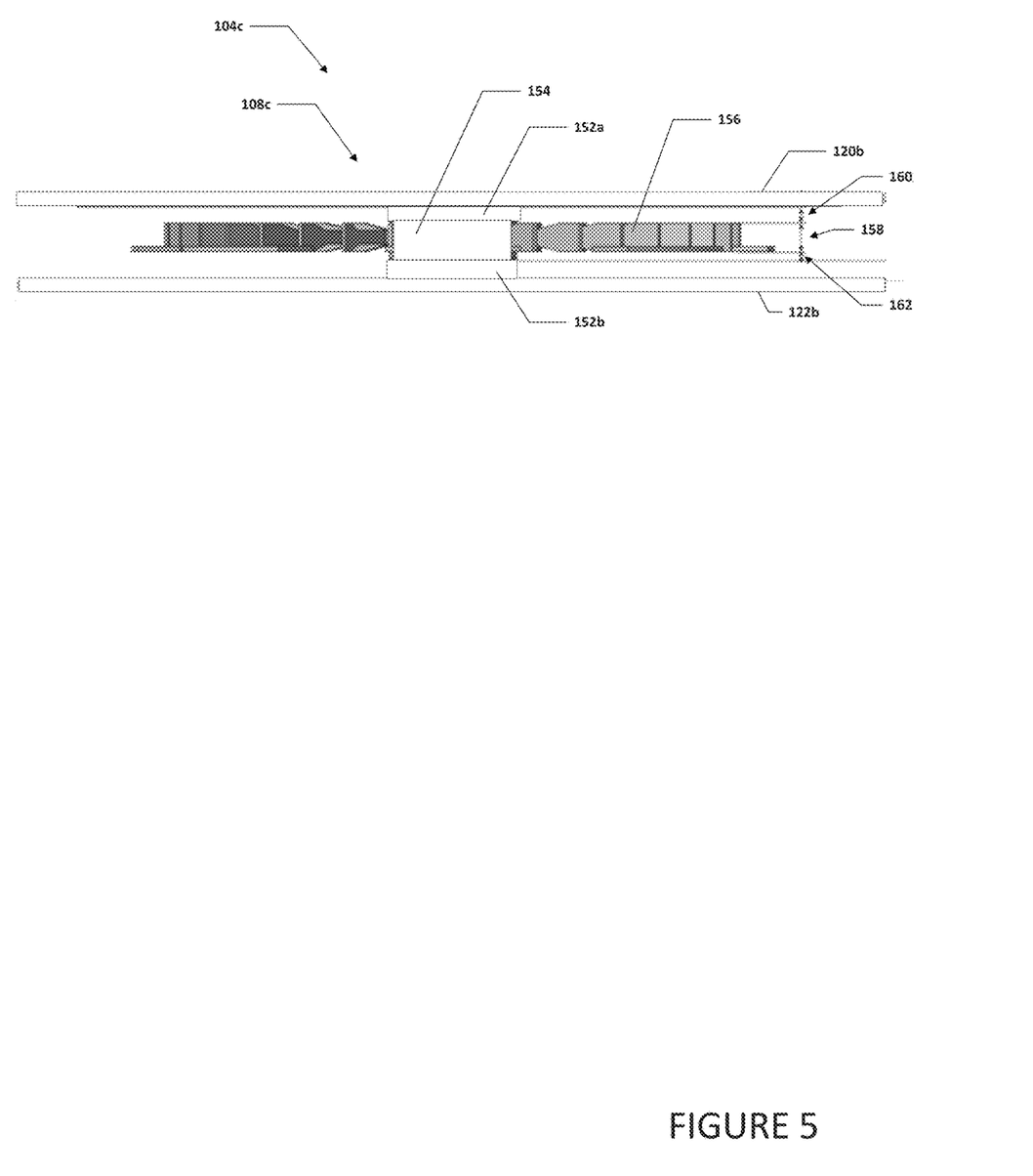
FIG. 5 is a simplified block diagram of a portion of a system to enable a fan support system, in accordance with an embodiment of the present disclosure.

Turning to FIG. 5, FIG. 5 is simplified side view cutaway block diagram of a portion of an electronic device configured to include a fan support. In an example, a second housing 104c can include a top cover 120b and a bottom cover 122b. Second housing 104c may be a standalone device where there is not a first housing (e.g., a tablet, smartphone, etc.). Top cover 120b and bottom cover 122b can be part of the chassis of second housing 104c.

Second housing 104c can include a fan 108c and rotation elements 152a and 152b. Fan 108c can include rotating shaft 154 and integrated fan blades 156. Rotation element 152a can be secured to top cover 120b and rotation element 152b can be secured to bottom cover 122b. Rotating shaft 154 can extend from rotation element 152a to rotation element 152b.

In an example, rotating shaft 154 is not decoupled from integrated fan blades 156 and rotating shaft 154 and integrated fan blades 156 are a single integrated structure. More specifically, fan 108c may be a currently used fan with a sleeve bearing and a stator section. However, unlike currently fan designs where if there is deflection of the chassis, the chassis can come into contact with the rotating parts of the fan, rotating shaft 154 can be coupled to rotation elements 152a and 152b. Because rotating shaft 154 is coupled to rotation elements 152a and 152b, if there is deflection of the chassis (e.g., top cover 120b and/or bottom cover 122b), the chassis will not come into contact with rotating shaft 154 or other rotating parts of fan 108c.

In some current fan designs, a relatively large gap (e.g., 1.2-1.5 millimeters) is used to help avoid interference with the rotor part of the fan and the chassis under external loading conditions and to ensure that the chassis does not interfere with the rotating parts of the fan. In addition, a thicker chassis in the vicinity of the fan may also be used to help avoid deflection of the chassis and to ensure that the adjacent components not interfere with the rotating parts of the fan so, even under loading, the chassis will not come into contact with the rotating parts of the fan. Also, some systems include structural support pillars to try and keep the chassis and/or adjacent components from interfering with the rotating parts of the fan.

Because rotating shaft 154 extends from rotation element 152a to rotation element 152b, as illustrated in FIG. 4, rotation elements 152a and 152b and rotating shaft 154 can function as a support pillar between top cover 120b and bottom cover 122b and can help to ensure that top cover 120b and bottom cover 122b do not interfere with the rotating parts of fan 108c. This allows integrated fan blades 156 to have a relatively large fan blade height 158 as compared to some existing fans. Also, a first fan blade clearance 160, or the distance between integrated fan blades 156 and top cover 120b, and a second fan blade clearance 162, or the distance between integrated fan blades 156 and bottom cover 122b, can be relatively small when compared to some existing fans. Fan blade height 158 can be relatively large and first fan blade clearance 160 and second fan blade clearance 162 can be relatively small because deflection of the chassis will not cause interference with the rotor part of the fan, even under loading conditions. More specifically, fan blade height 158 can be about 3.6 millimeters, about 4.3 millimeters, about 3 millimeters to about 5 millimeters, above about 3 millimeters, or some other height based on design constraints. First fan blade clearance 160 can be about 0.5 millimeters, about 0.5 millimeters to about 0.8 millimeters, about 0.5 millimeters to about one (1) millimeter, about 0.5 millimeters to about 1.5 millimeters, or some other clearance distance based on design constraints. Second fan blade clearance 162 can be about 0.5 millimeters, about 0.5 millimeters to about 0.8 millimeters, about 0.5 millimeters to about one (1) millimeter, about 0.5 millimeters to about 1.5 millimeters, or some other clearance distance based on design constraints.

Figure 6A:
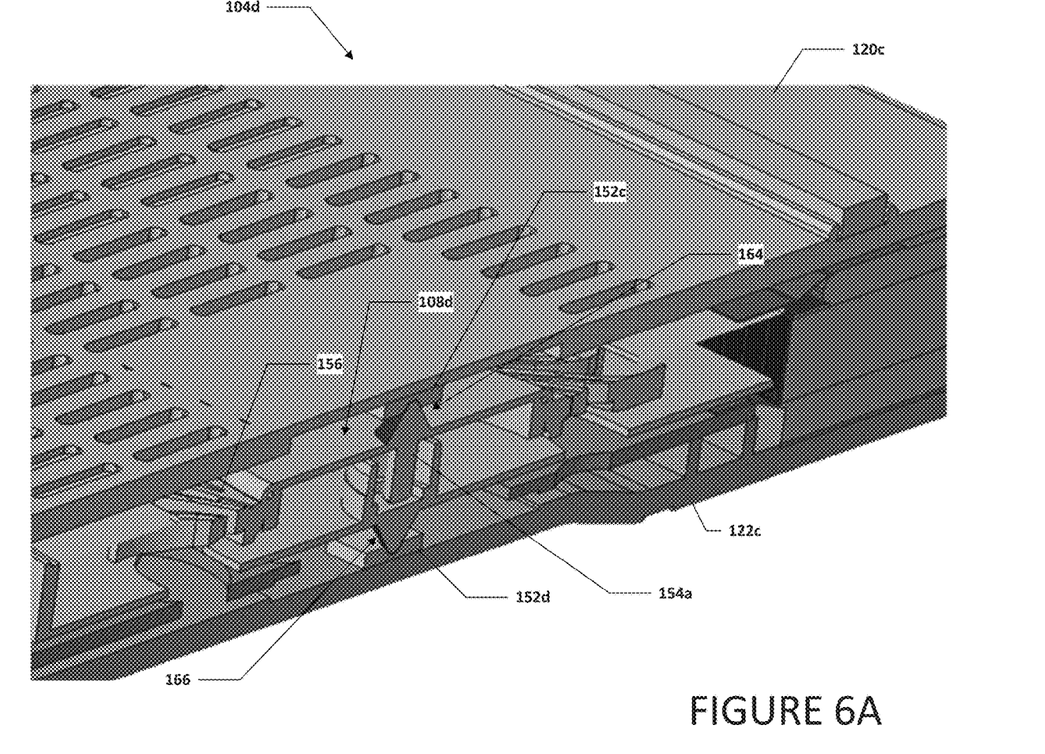
FIGS. 6A and 6B are is a simplified block diagram of a portion of a system to enable a fan support system, in accordance with an embodiment of the present disclosure.

Turning to FIG. 6A, FIG. 6A is a simplified perspective cut away block diagram of a portion of an electronic device configured to include a fan support. In an example, a second housing 104d can include a top cover 120c and a bottom cover 122c. Second housing 104d may be a standalone device where there is not a first housing (e.g., a tablet, smartphone, etc.). Top cover 120c and bottom cover 122c can be part of the chassis of second housing 104d.

Second housing 104d can include a fan 108d and rotation elements 152c and 152d. Fan 108d can include rotating shaft 154a and integrated fan blades 156. Rotation element 152c can be secured to top cover 120c and rotation element 152d can be secured to bottom cover 122c. Rotating shaft 154a can extend from rotation element 152c to rotation element 152d. In an example, rotating shaft 154a can include a first end 164 and a second end 166. First end 164 of rotating shaft 154a can have a profile that couples with rotation element 152c and second end 166 of rotating shaft 154a can have a profile that couples with rotation element 152d. In some examples, first end 164 and second end 166 are part of rotating shaft 154a and they are all made from the same material. In other examples, first end 164 and second end 166 are added to rotating shaft 154a after rotating shaft 154 is manufactured and first end 164 and second end 166 are made of a different material than the material used to create rotating shaft 154a.

In an example, rotating shaft 154a is not decoupled from integrated fan blades 156 and rotating shaft 154a and integrated fan blades 156 are a single integrated structure. More specifically, fan 108d may be a currently used fan with a sleeve bearing and a stator section. However, unlike currently fan designs where if there is deflection of the chassis, the chassis can come into contact with the rotating parts of the fan, rotating shaft 154a can be coupled to rotation elements 152c and 152d. Because rotating shaft 154a is coupled to rotation elements 152c and 152d, if there is deflection of the chassis (e.g., top cover 120c and/or bottom cover 122c), the chassis will not come into contact with rotating shaft 154a or other rotating parts of fan 108d.

Figure 6B:
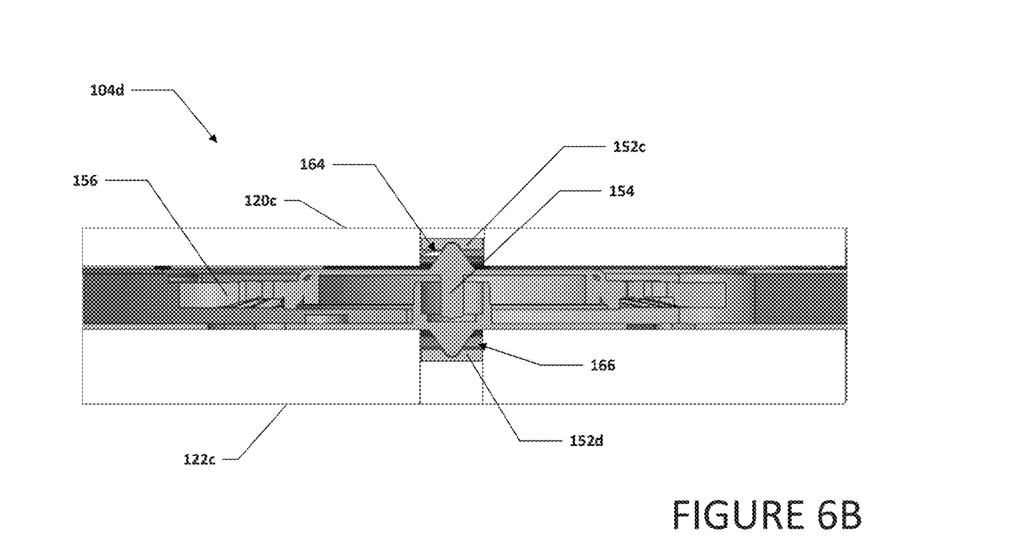

Turning to FIG. 6B, FIG. 6B is simplified side view cutaway block diagram of a portion of an electronic device configured to include a fan support. In an example, a second housing 104d can include top cover 120c and bottom cover 122c. Second housing 104d may be a standalone device where there is not a first housing (e.g., a tablet, smartphone, etc.). Top cover 120c and bottom cover 122c can be part of the chassis of second housing 104d.

Second housing 104d can include fan 108d and rotation elements 152c and 152d. Fan 108d can include rotating shaft 154a and integrated fan blades 156. Rotation element 152c can be secured to top cover 120c and rotation element 152d can be secured to bottom cover 122c. Rotating shaft 154a can extend from rotation element 152c to rotation element 152d. In an example, rotating shaft 154a can include first end 164 and second end 166. First end 164 of rotating shaft 154a can have a profile that couples with rotation element 152c and second end 166 of rotating shaft 154a can have a profile that couples with rotation element 152d.

In an example, rotating shaft 154a is not decoupled from integrated fan blades 156 and rotating shaft 154a and integrated fan blades 156 are a single integrated structure. More specifically, fan 108d may be a currently used fan with a sleeve bearing and a stator section. However, unlike currently fan designs where if there is deflection of the chassis, the chassis can come into contact with the rotating parts of the fan, rotating shaft 154a can be coupled to rotation elements 152c and 152d. Because rotating shaft 154a is coupled to rotation elements 152c and 152d, if there is deflection of the chassis (e.g., top cover 120c and/or bottom cover 122c), the chassis will not come into contact with rotating shaft 154a or other rotating parts of fan 108d.

Figure 7A:
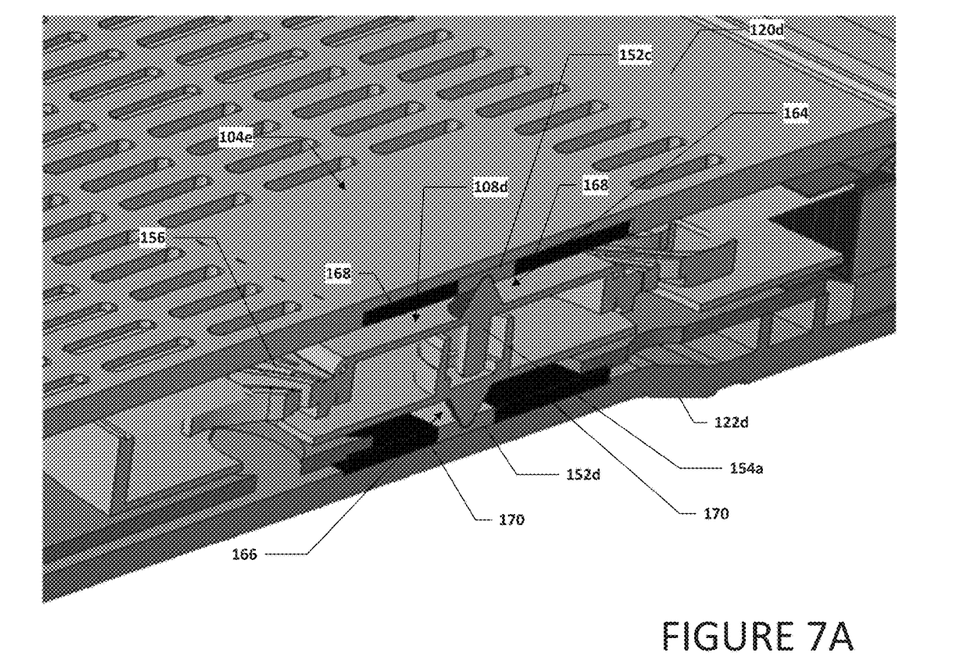
FIGS. 7A and 7B are is a simplified block diagram of a portion of a system to enable a fan support system, in accordance with an embodiment of the present disclosure.

Turning to FIG. 7A, FIG. 7A is a simplified perspective cut away block diagram of a portion of an electronic device configured to include a fan support. In an example, a second housing 104e can include a top cover 120d and a bottom cover 122d. Second housing 104e may be a standalone device where there is not a first housing (e.g., a tablet, smartphone, etc.). Top cover 120d and bottom cover 122d can be part of the chassis of second housing 104e.

Second housing 104e can include a fan 108d, rotation elements 152c and 152d, and anti-vibration layers 168a and 168b. Fan 108d can include rotating shaft 154a and integrated fan blades 156. Rotation element 152c can be secured to top cover 120c and rotation element 152d can be secured to bottom cover 122c. Rotating shaft 154a can extend from rotation element 152c to rotation element 152d. In an example, rotating shaft 154a can include a first end 164 and a second end 166. First end 164 of rotating shaft 154a can have a profile that couples with rotation element 152c and second end 166 of rotating shaft 154a can have a profile that couples with rotation element 152d. Anti-vibration layer 168a can at least partially surround rotation element 152c. Anti-vibration layer 168b can at least partially surround rotation element 152d.

In an example, rotating shaft 154a is not decoupled from integrated fan blades 156 and rotating shaft 154a and integrated fan blades 156 are a single integrated structure. More specifically, fan 108d may be a currently used fan with a sleeve bearing and a stator section. However, unlike current fan designs where if there is deflection of the chassis, the chassis can come into contact with the rotating parts of the fan, rotating shaft 154a can be coupled to rotation elements 152c and 152d. Because rotating shaft 154a is coupled to rotation elements 152c and 152d, if there is deflection of the chassis (e.g., top cover 120d and/or bottom cover 122d), the chassis will not come into contact with rotating shaft 154a or other rotating parts of fan 108d. Anti-vibration layers 168a and 168b can be configured to help reduce vibrations and oscillations from rotating shaft 154a and/or rotation elements 152c and 152d and may comprise foam or some other material that can help reduce vibrations and oscillations from rotating shaft 154a and/or rotation elements 152c and 152d.

Figure 7B:
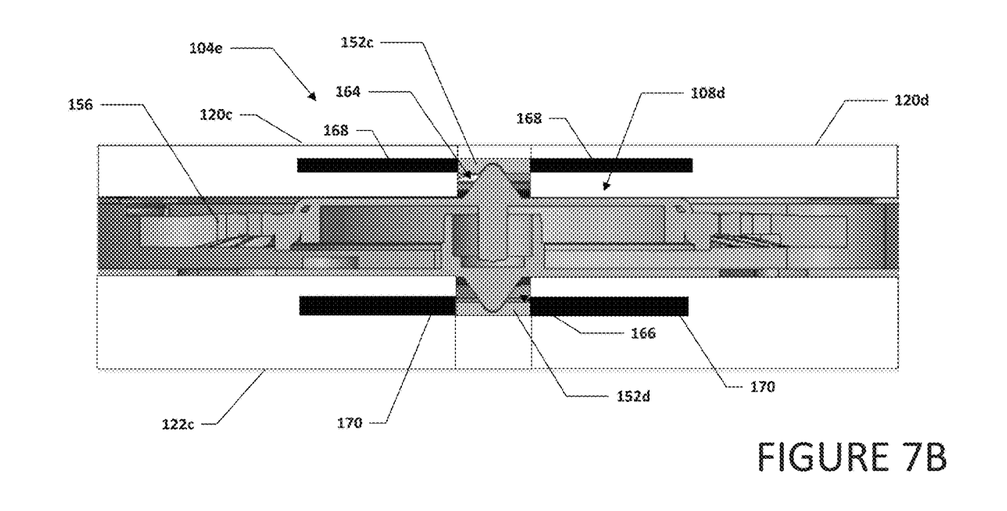

Turning to FIG. 7B, FIG. 7B is simplified side view cutaway block diagram of a portion of an electronic device configured to include a fan support. In an example, second housing 104e can include top cover 120d and bottom cover 122d. Second housing 104e may be a standalone device where there is not a first housing (e.g., a tablet, smartphone, etc.). Top cover 120d and bottom cover 122d can be part of the chassis of second housing 104e.

Second housing 104e can include fan 108d, rotation elements 152c and 152d, and anti-vibration layers 168a and 168b. Fan 108d can include rotating shaft 154a and integrated fan blades 156. Rotation element 152c can be secured to top cover 120c and rotation element 152d can be secured to bottom cover 122c. Rotating shaft 154a can extend from rotation element 152c to rotation element 152d. In an example, rotating shaft 154a can include first end 164 and second end 166. First end 164 of rotating shaft 154a can have a profile that couples with rotation element 152c and second end 166 of rotating shaft 154a can have a profile that couples with rotation element 152d. Anti-vibration layer 168a can at least partially surround rotation element 152c. Anti-vibration layer 168b can at least partially surround rotation element 152d.

In an example, rotating shaft 154a is not decoupled from integrated fan blades 156 and rotating shaft 154a and integrated fan blades 156 are a single integrated structure. More specifically, fan 108d may be a currently used fan with a sleeve bearing and a stator section. However, unlike current fan designs where if there is deflection of the chassis, the chassis can come into contact with the rotating parts of the fan, rotating shaft 154a can be coupled to rotation elements 152c and 152d. Because rotating shaft 154a is coupled to rotation elements 152c and 152d, if there is deflection of the chassis (e.g., top cover 120d and/or bottom cover 122d), the chassis will not come into contact with rotating shaft 154a or other rotating parts of fan 108d. Anti-vibration layers 168a and 168b can be configured to help reduce vibrations and oscillations from rotating shaft 154a and/or rotation elements 152c and 152d and may comprise foam or some other material that can help reduce vibrations and oscillations from rotating shaft 154a and/or rotation elements 152c and 152d.

Figure 8:
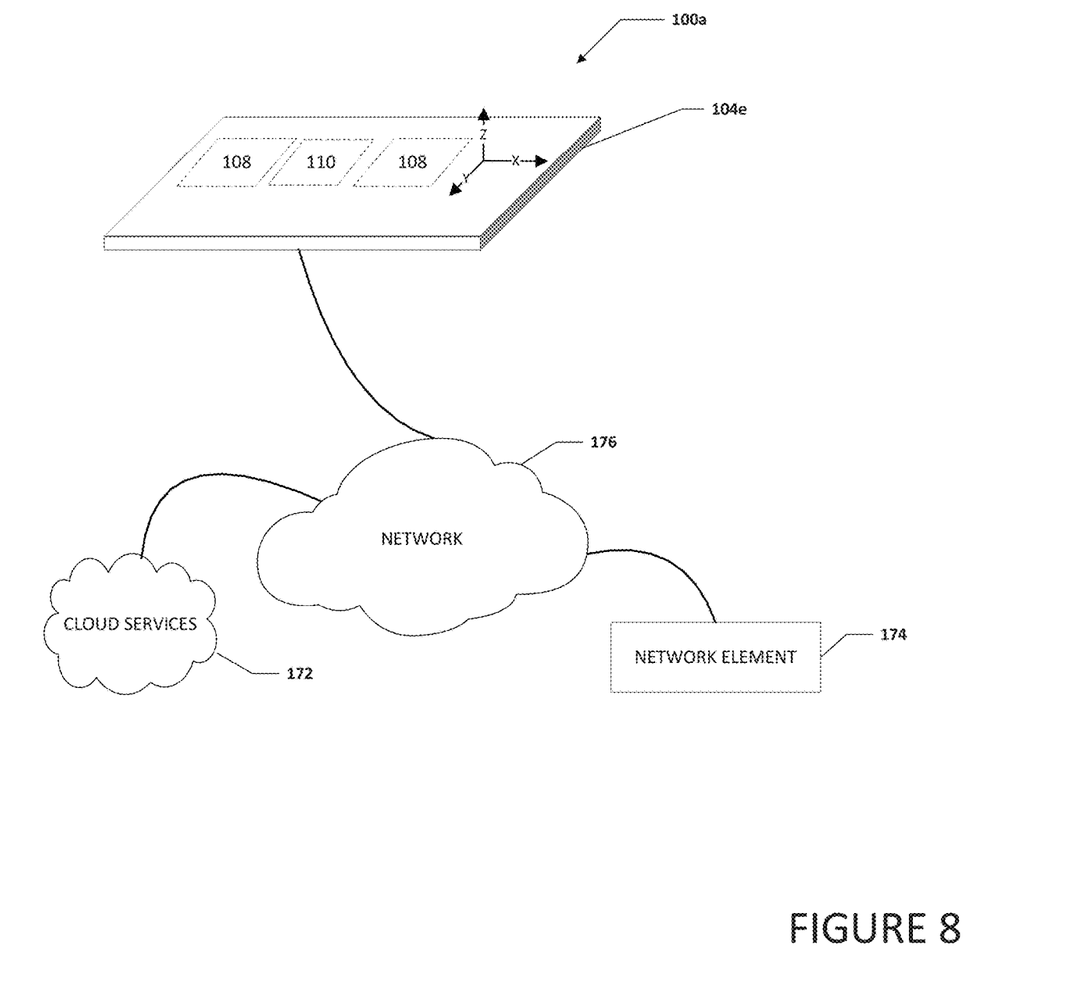
FIG. 8 is a simplified block diagram of a device that includes a fan support system, in accordance with an embodiment of the present disclosure.

Turning to FIG. 8, FIG. 8 is a simplified block diagram of a portion of an electronic device configured to include a fan support. In an example, an electronic device 100a can include one or more fans 108 and heat source 110. Electronic device 100a may be a handheld device, a tablet, smartphone, or other similar device that includes a fan and a heat source. Electronic device 100a may be in communication with cloud services 172 and/or network element 174 using network 176. In an example, electronic device 100a is a standalone device and not connected to network 176.

Elements of FIG. 8 may be coupled to one another through one or more interfaces employing any suitable connections (wired or wireless), which provide viable pathways for network (e.g., network 176, etc.) communications. Additionally, any one or more of these elements of FIG. 8 may be combined or removed from the architecture based on particular configuration needs. Network 176 may include a configuration capable of transmission control protocol/Internet protocol (TCP/IP) communications for the transmission or reception of packets in a network. Electronic device 100a may also operate in conjunction with a user datagram protocol/IP (UDP/IP) or any other suitable protocol where appropriate and based on particular needs.

Turning to the infrastructure of FIG. 8, network 176 represents a series of points or nodes of interconnected communication paths for receiving and transmitting packets of information. Network 176 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 176, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks. The data may help determine a status of a network element or network. Additionally, messages, requests, responses, and queries are forms of network traffic, and therefore, may comprise packets, frames, signals, data, etc.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. For example, electronic devices 100 and 100*a* may include two or more fans 108 with each fan 108 being independently controlled by thermal management engine 114 or controlled as a unit or group. Additionally, although electronic devices 100 and 100*a* have been illustrated with reference to particular elements and operations that facilitate the thermal cooling process, these elements and operations may be replaced by any suitable architecture, protocols, and/or processes that achieve the intended functionality disclosed herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device can include a center shaft, a motor coil support, motor coils coupled to the motor coil support, a rotator coupled to the center shaft, and fan blades coupled to the rotator, where rotation of the fan blades is decoupled from the center shaft by the rotator.

In Example A2, the subject matter of Example A1 can optionally include where a blade support coupled to the rotator, where the blade support couples the fan blades to the rotator and magnets coupled to the blade support.

In Example A3, the subject matter of any one of Examples A1-A2 can optionally include where the rotator includes an inner race, bearings, and an outer race, wherein the blade support is coupled to the outer race.

In Example A4, the subject matter of any one of Examples A1-A3 can optionally include where the inner race is coupled to the center shaft.

In Example A5, the subject matter of any one of Examples A1-A4 can optionally include where the center shaft, the motor coil support, and the motor coils are static and do not rotate.

In Example A6, the subject matter of any one of Examples A1-A5 can optionally include where the fan is in a chassis of an electronic device and the center shaft extends from a first side of the chassis towards a second side of the chassis and there is a gap less than about one (1) millimeter between the second side of the chassis and the center shaft.

In Example A7, the subject matter of any one of Examples A1-A6 can optionally include where the fan is located in a laptop computer.

Example AA1 is a device including memory, at least one heat source, and one or more fans. At least one of the one or more fans includes a center shaft, a motor coil support, motor coils coupled to the motor coil support, a rotator coupled to the center shaft, and fan blades coupled to the rotator, where rotation of the fan blades is decoupled from the center shaft by the rotator.

In Example AA2, the subject matter of Example AA1 can optionally include where the at least one of the one or more fans further includes a blade support coupled to the rotator, where the blade support couples the fan blades to the rotator and magnets coupled to the blade support.

In Example AA3, the subject matter of any one of the Examples AA1-AA2 can optionally include where the rotator includes an inner race, bearings, and an outer race, wherein the blade support is coupled to the outer race.

In Example AA4, the subject matter of any one of the Examples AA1-AA3 can optionally include where the inner race is coupled to the center shaft.

In Example AA5, the subject matter of any one of the Examples AA1-AA4 can optionally include where the center shaft, the motor coil support, and the motor coils are static and do not rotate.

In Example AA6, the subject matter of any one of the Examples AA1-AA5 can optionally include where the center shaft extends from a first side of a chassis of the electronic device towards a second side of the chassis and there is a gap less than about one (1) millimeter between the second side of the chassis and the center shaft.

In Example AA7, the subject matter of any one of the Examples AA1-AA6 can optionally include where the at least one heat source is a processor.

Example M1 is a method including receiving data related to thermal properties of at least one heat source, and activating a fan based on the received data. The fan includes a center shaft, a motor coil support, motor coils coupled to the motor coil support, a rotator coupled to the center shaft, and fan blades coupled to the rotator, where rotation of the fan blades is decoupled from the center shaft by the rotator.

In Example M2, the subject matter of Example M1 can optionally include where the fan further includes a blade support coupled to the rotator, where the blade support couples the fan blades to the rotator and magnets coupled to the blade support.

In Example M3, the subject matter of any one of the Examples M1-M2 can optionally include where the rotator includes an inner race, bearings, and an outer race, wherein the blade support is coupled to the outer race.

In Example M4, the subject matter of any one of the Examples M1-M3 can optionally include where the inner race is coupled to the center shaft.

In Example M5, the subject matter of any one of the Examples M1-M4 can optionally include where the center shaft, the motor coil support, and the motor coils are static and do not rotate.

In Example M6, the subject matter of any one of the Examples M1-M5 can optionally include where the fan is located in a laptop computer.

Example AAA1 is an apparatus including means for receiving data related to thermal properties of at least one heat source and means for activating a fan based on the received data. The fan includes a center shaft, a motor coil support, motor coils coupled to the motor coil support, a rotator coupled to the center shaft, and fan blades coupled to the rotator, where rotation of the fan blades is decoupled from the center shaft by the rotator.

In Example AAA2, the subject matter of Example AAA1 can optionally include where the fan further includes a blade support coupled to the rotator, where the blade support couples the fan blades to the rotator and magnets coupled to the blade support.

In Example AAA3, the subject matter of any one of Examples AAA1-AAA2 can optionally include where the rotator includes an inner race, bearings, and an outer race, wherein the blade support is coupled to the outer race.

In Example AAA4, the subject matter of any one of Examples AAA1-AAA3 can optionally include where the inner race is coupled to the center shaft.

In Example AAA5, the subject matter of any one of Examples AAA1-AAA4 can optionally include where the center shaft, the motor coil support, and the motor coils are static and do not rotate.

In Example AAA6, the subject matter of any one of Examples AAA1-AAA5 can optionally include where the fan is located in a laptop computer.

What is claimed is:

1. A fan comprising:
   a center shaft;
   a motor coil support;
   motor coils coupled to the motor coil support;
   a rotator coupled to the center shaft, wherein the rotator is between the center shaft and the motor coils; and
   fan blades coupled to the rotator, wherein rotation of the fan blades is decoupled from the center shaft by the rotator.

2. The fan of claim 1, further comprising:
   a blade support coupled to the rotator, wherein the blade support couples the fan blades to the rotator; and
   magnets coupled to the blade support.

3. The fan of claim 2, wherein the rotator includes an inner race, bearings, and an outer race, wherein the blade support is coupled to the outer race.

4. The fan of claim 3, wherein the inner race is coupled to the center shaft.

5. The fan of claim 1, wherein the center shaft, the motor coil support, and the motor coils are static and do not rotate.

6. The fan of claim 1, wherein the fan is in a chassis of an electronic device and the center shaft extends from a first side of the chassis towards a second side of the chassis and there is a gap less than about one (1) millimeter between the second side of the chassis and the center shaft.

7. The fan of claim 1, wherein the fan is located in a laptop computer.

8. An electronic device comprising:
   memory;
   at least one heat source; and
   one or more fans, wherein at least one of the one or more fans includes:
      a center shaft;
      a motor coil support;
      motor coils coupled to the motor coil support;
      a rotator coupled to the center shaft, wherein the rotator is between the center shaft and the motor coils; and
      fan blades coupled to the rotator, wherein rotation of the fan blades is decoupled from the center shaft by the rotator.

9. The electronic device of claim 8, wherein the at least one of the one or more fans further includes:
   a blade support coupled to the rotator, wherein the blade support couples the fan blades to the rotator; and
   magnets coupled to the blade support.

10. The electronic device of claim 9, wherein the rotator includes an inner race, bearings, and an outer race, wherein the blade support is coupled to the outer race.

11. The electronic device of claim 10, wherein the inner race is coupled to the center shaft.

12. The electronic device of claim 8, wherein the center shaft, the motor coil support, and the motor coils are static and do not rotate.

13. The electronic device of claim 8, wherein the center shaft extends from a first side of a chassis of the electronic device towards a second side of the chassis and there is a gap less than about one (1) millimeter between the second side of the chassis and the center shaft.

14. The electronic device of claim 8, wherein the at least one heat source is a processor.

15. A method comprising:
   receiving data related to thermal properties of at least one heat source; and
   activating a fan based on the received data, wherein the fan includes:
      a center shaft;
      a motor coil support;
      motor coils coupled to the motor coil support;
      a rotator coupled to the center shaft, wherein the rotator is between the center shaft and the motor coils; and
      fan blades coupled to the rotator, wherein rotation of the fan blades is decoupled from the center shaft by the rotator.

16. The method of claim 15, wherein the fan further includes:
   a blade support coupled to the rotator, wherein the blade support couples the fan blades to the rotator; and
   magnets coupled to the blade support.

17. The method of claim 16, wherein the rotator includes an inner race, bearings, and an outer race, wherein the blade support is coupled to the outer race.

18. The method of claim 17, wherein the inner race is coupled to the center shaft.

19. The method of claim 15, wherein the center shaft, the motor coil support, and the motor coils are static and do not rotate.

20. The method of claim 15, wherein the fan is located in a laptop computer.

* * * * *